United States Patent [19]

Castonguay et al.

[11] 3,980,438
[45] Sept. 14, 1976

[54] APPARATUS FOR FORMING SEMICONDUCTOR CRYSTALS OF ESSENTIALLY UNIFORM DIAMETER

[75] Inventors: Roger A. Castonguay, Salem; Martin L. Cohen, Belmont; Wilson P. Menashi, Lexington; Joseph F. Wenckus, Needham; Peter C. VonThüna, Lexington, all of Mass.

[73] Assignee: Arthur D. Little, Inc., Cambridge, Mass.

[22] Filed: Aug. 28, 1975

[21] Appl. No.: 608,522

[52] U.S. Cl. .......................... 23/273 SP; 156/601; 156/602; 156/617 SP; 324/65 R
[51] Int. Cl.² .................. B01J 17/00; B01J 17/18
[58] Field of Search ............... 23/273 SP; 156/601, 156/617, 602; 324/65 R

[56] References Cited
UNITED STATES PATENTS

| | | | |
|---|---|---|---|
| 2,908,004 | 10/1959 | Levinson | 156/601 |
| 3,346,344 | 10/1967 | Levinstein et al. | 23/273 SP X |
| 3,459,152 | 8/1969 | Garrison et al. | 156/601 X |
| 3,822,111 | 7/1974 | Suzuki et al. | 23/273 SP |
| 3,934,983 | 1/1976 | Bardsley et al. | 23/273 SP |
| 3,935,058 | 1/1976 | Kuhlmann-Schafer | 23/273 SP X |

FOREIGN PATENTS OR APPLICATIONS 913,677  12/1962  United Kingdom............... 23/301

*Primary Examiner*—Norman Yudkoff
*Assistant Examiner*—Barry I. Hollander
*Attorney, Agent, or Firm*—Bessie A. Lepper

[57] ABSTRACT

Apparatus is provided for forming, by the Czochralski technique, single semiconductor crystals having essentially uniform diameters throughout their lengths. The apparatus includes means to monitor and control crystal diameter which takes advantage of the fact that the melt volume from which the crystal is pulled and the dielectric crucible containing the melt volume can be incorporated in a crucible assembly circuit in which the resistance varies with the melt volume level in the crucible. Determination of the difference between the measured resistance in the crucible assembly circuit and a programmed reference resistance produces a signal which is used to control one of two operational parameters—the rate at which the crystal is pulled or the temperature of the melt volume—to produce a uniform-diameter crystal.

18 Claims, 4 Drawing Figures

APPARATUS FOR FORMING SEMICONDUCTOR CRYSTALS OF ESSENTIALLY UNIFORM DIAMETER

This invention relates to forming single crystals of semiconductor materials by the Czochralski method and more particularly to the forming of such single crystals having an essentially uniform diameter.

The formation of single crystals of such refractory materials as alumina, spinel, garnet and the like and of the relatively high-melting semiconductor materials such as gallium arsenide, gallium phosphide and the like by the so-called Czochralski technique is well known. By this technique, single crystals are formed by contacting the surface of a molten mass of the material from which the crystal is to be formed with a seed crystal and then slowly pulling the desired crystal, adhered to the seed crystal, from the molten mass. Although this is a highly satisfactory technique for forming large single crystals, it has the distinct disadvantage of giving rise to crystals having grossly uneven diameters along their length even when a constant pulling speed is maintained. This is mainly brought about by the fact that as the crystal is pulled it removes melt from the crucible containing it and the changing melt volume often gives rise to changes in the temperature of the melt which influences the diameter of the growing crystal.

Although it is possible to use the resulting crystals having nonuniform diameters, they are not really desirable. Crystals having an essentially uniform diameter throughout their lengths provide a much higher yield of finished products in subsequent fabrication and are of much more uniform quality throughout. Thus crystals of uniform diameter ultimately provide advantages in cost and quality control.

An essentially uniform diameter crystal may, however, be formed provided one of two operational parameters is properly varied as the crystal is formed. These parameters are the rate at which the pulling head which imparts translational movement to the seed crystal is moved and the energy input into the heating means around the crucible. Thus, slowing the rate of pulling head movement increases the crystal diameter; while varying the heat input varies the temperature of the melt, a factor which is reflected in the crystal diameter.

Although it is possible to have a technician constantly monitor the system and make the necessary adjustments in pulling head movement rate and/or in melt temperature, this is, of course, not an economical practice. The problem of automating the control over Czochralski crystal pulling of the refractory, dielectric material such as alumina, spinel, garnet and the like has been resolved through the use of means to continually monitor the increasing weight of the crystal (or conversely the decreasing weight of the molten mass remaining in the crucible) and using the data obtained to control one of the two above-mentioned operational parameters. Such monitoring and control means are quite satisfactory for those materials such as alumina and the like which can be processed under ambient conditions or in confined surroundings which provide the space and access necessary for the operation of such means. However, the forming of crystals of semiconductor materials containing one or more volatile constituents requires conditions to which the present monitoring and control means based on weight monitoring are adaptable only with great difficulty. These conditions include confinement of the crucible containing the melt volume and its associated support, heating means and a portion of the crystal pulling head within a high-pressure (up to 100 atmospheres) high-temperature (up to 4000°C) furnace. The working volume within such a furnace is not suitable for the installation of weight-determining apparatus.

The semiconductor materials which are of particular interest and for which the apparatus of this invention is particularly suited include those generally referred to as Group III–V, Group II–VI and Group II–IV–VI compounds as well as elemental semiconductors such as silicon and germanium. These materials may be used as the detector elements in infrared detectors, as light-emitting diodes, as infrared window elements, and in Gunn diodes and Hall generators. Exemplary of Group III–V compounds are those formed by reacting one or more of such Group III elements as gallium and indium with one or more of such Group V elements as phosphorus, arsenic and antimony. Exemplary of such Group II–VI compounds are those formed by reacting one or more of such Group II elements as zinc, cadmium and mercury with one or more of such Group VI elements as sulfur, selenium and tellurium. Mercury-cadmium-telluride, lead-tin-telluride and lead-tin-selenide may be cited as examples of ternary systems formed of Group II–IV–VI compounds.

Many of these elemental components have very high vapor pressures at elevated temperatures both in their elemental state and in their combined state, a fact which has made the formation of single crystals of these materials difficult and costly. Thus considerable technical difficulty is encountered in the processing of these and other volatile materials, and much ingenuity is required to avoid the loss of material by volatilization which can lead to decomposition, formation of inhomogenous crystals, or in some cases even catastrophic failure of the system.

Although the principal difficulties of producing single crystals from the polycrystalline materials such as the arsenides, phosphides, tellurides, selenides and the like have been largely overcome by use of liquid-encapsulated crystal growing techniques carried out in high-temperature, high-pressure furnaces, some means must still be found to control the crystal forming parameters within the limited confines of such furnaces. These means must be reliable, simple to operate and preferably inexpensive. The apparatus of this invention provides such means.

It is therefore a primary object of this invention to provide apparatus for forming semiconductor crystals by the Czochralski method such that the crystals have an essentially uniform diameter throughout their lengths. Another object of this invention is to provide apparatus of the character described which is particularly suited to semiconductors which contain one or more volatile constituents and which must be processed within a high-pressure furnace. Still a further object is to provide a simple and reliable means to monitor and control the diameter of relatively large semiconductor crystals as they are formed by pulling from a melt volume. Other objects of the invention will in part be obvious and will in part be apparent hereinafter.

The apparatus known in the art for forming a single crystal of one of the above-mentioned semiconductor materials by pulling it from a melt volume generally comprises a quartz crucible containing the melt volume, support means for the quartz crucible, heating means to form and maintain the melt volume, load-bearing rod means for holding a seed crystal and for imparting translational (and if desired rotational) motion to the crystal attached to the seed crystal and variable-speed motor means to drive the load-bearing rod means.

According to this invention, when the melt volume is a semiconductor material, advantage is taken of the fact that the quartz crucible, its contents and support system may be included in an electrical circuit and serve as a variable resistance, the value of which varies as a unique function of the height of the melt volume within the quartz crucible. Thus as the melt volume decreases, the surface area within the quartz crucible which is in contact with the melt volume decreases which means that the resistance of the crucible assembly increases. The difference between this change in resistance and a predetermined programmed resistance function based upon the withdrawal of a uniform amount of melt volume to form a uniform diameter crystal is employed to generate an appropriate signal which may be used to alter either the speed of the variable-speed motor associated with the pulling head and hence the crystal pulling rate or the power to the heating means and hence the temperature of the melt volume. In either case, the continual monitoring and adjusting of the operational parameter chosen results in the formation of a crystal with essentially uniform diameter.

Although quartz is generally used to make the crucibles for containing the melt volume and is used herein as exemplary of a crucible material, it is within the scope of this invention to use other dielectric materials such as alumina, beryllia, magnesia and the like for the crucible. The requirements for the crucible material are that it can contain the semiconductor material in a molten state, that it is a dielectric and that it exhibits an essentially constant electrical resistance over the relatively narrow temperature range required for crystal growing.

In the drawings described below, the crucible is shown for convenience as a right cylindrical configuration. In such a configuration the variation in the resistance of the crucible assembly circuit with removal of molten material therefrom approaches a linear function. However, it is also within the scope of this invention to use a crucible of any other suitable configuration, in which case the variation in crucible assembly circuit resistance may easily be calculated and used in determining the programmed resistance function.

The means of this invention to monitor and control the crystal diameter therefore comprises crucible assembly circuit means to provide an electrical current through the crystal, the melt volume and the quartz crucible and its support to generate a measured signal; means to provide a reference signal representative of a predetermined crystal diameter and formation rate; comparator means to determine the difference between the measured and reference signals to generate an operational signal which is a function of that difference; and means to transmit the operational signal to either the variable-speed motor or the power source associated with the heating means.

The invention accordingly comprises the features of construction, combinations of elements, and arrangement of parts which will be exemplified in the constructions hereinafter set forth, and the scope of the invention will be indicated in the claims.

For a fuller understanding of the nature and objects of the invention, reference should be had to the following detailed description taken in connection with the accompanying drawings in which FIG. 1 is a diagrammatic representation of a crystal pulling apparatus suitable for performing the Czochralski method and incorporating the crystal diameter monitoring and control means of this invention;

Figure 1:
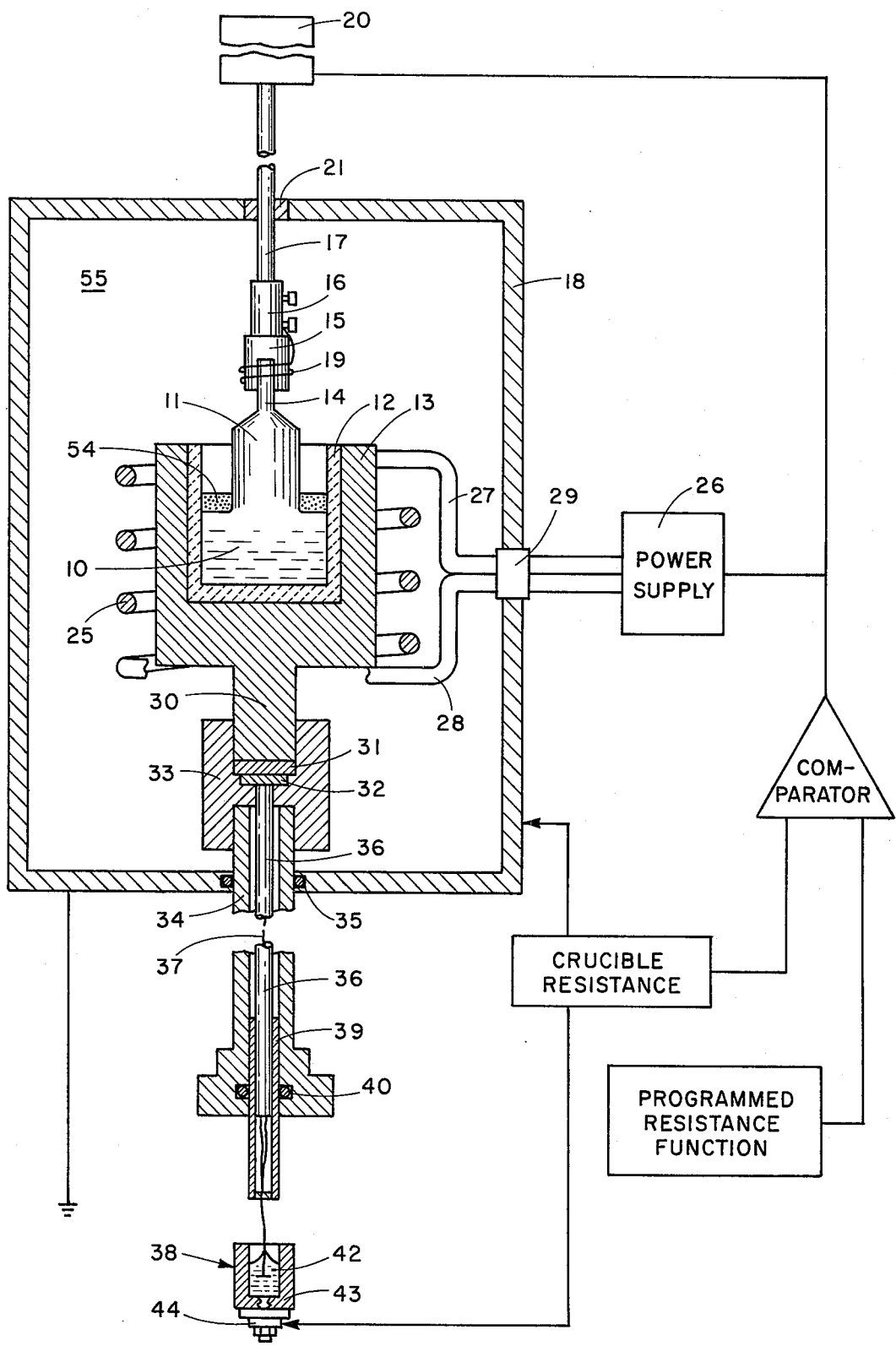

FIG. 1 illustrates, in somewhat diagrammatic form, apparatus for pulling a crystal form a melt volume using the wellknown Czochralski technique. The melt volume 10 from which crystal 11 is pulled is contained within quartz crucible 12 which is held in a crucible support 13. The seed 14 used to start the process is held in a seed holder 15 which in turn, is mounted on an electrically conductive adapter 16 held in a water-cooled load-bearing rod 17 connected to the housing 18 of a high-pressure, high-temperature furnace. The furnace housing is grounded as shown and the pulling head (adapter 16 and rod 17) is shorted to this housing. Seed holder 15 may be formed of an electrically insulating material, e.g., boron nitride, in which case it is necessary to provide an electrical connection between seed 14 and adapter 16 such as by wire 19 which may be formed of molybdenum. Crystal pulling is effected by imparting translational motion to load-bearing rod 17 through a variable-speed motor 20. The driving mechanism for rod 17 is preferably external of furnace housing 18, thus requiring a high-pressure bearing seal 21. A suitable load-bearing rod with driving mechanism is described in U.S. Pat. No. 3,552,931 and suitable complete high-pressure, high-temperature furnaces (represented by housing 18 in FIG. 1) are described in U.S. Pat. Nos. 3,639,718 and 3,865,554.

If the heating means, represented by coils 25 in FIG. 1, are rf coils, the crucible support 13 is preferably formed of graphite, serving also in the role of a suscepter. Alternatively, the heating means may be a resistance heater in which case crucible support 13 may be formed of graphite or an appropriate ceramic. Power from power source 26 is taken into the furnace through leads 27 and 28 which pass through a suitable pressure-tight seal 29, typically a Conax-type pressure gland.

Crucible support 13 has a pedestal 30 terminating in a molybdenum disk 31 and a contact wire 32. The pedestal 30 sits in an electrically insulating support 33 formed, for example, of boron nitride and this support in turn rests on crucible support shaft 34 that passes through furnace housing 18 and is sealed by sealing ring 35. A ceramic, e.g., alumina, insulating conduit 36 passes down through crucible support shaft 34 to insulate conducting wire 37 which connects contact wire 32, and hence the crucible assembly to a mercury contact 38. A stainless steel sheath 39, with an o-ring seal 40, extends into crucible support shaft 34 to hold insulating conduit 36 in alignment. In mercury contact 38, wire 37 is immersed in a mercury pool 42 held in a plexiglass container 43 and electrical connection is made through the mercury and a contact 44. The circuit through the crucible assembly is thus complete. The apparatus shown in FIG. 1 is suitable for handling semiconductor materials, such as gallium arsenide, which contain one or more volatile constituents. In such cases, the melt volume 10 is covered with a liquid encapsulant 54, such as $B_2O_3$, and the furnace volume 55 is adequately pressurized.

As crystal 11 is pulled, melt volume 10 of course decreases by an amount equal to the crystal volume increase. By establishing a desired crystal diameter and pulling rate, and hence a rate of crystal volume increase, it is a simple matter to calculate, from the melt volume decrease, the rate at which the melt level in quartz crucible 12 is to fall. The quartz crucible is highly resistive and thus constitutes the primary resistance in the crucible assembly circuit, defined as that circuit extending from furnace housing 18 through rod 17, crystal 11, melt 10, crucible 13, the crucible support system, and mercury contact 38. This resistance, $R_x$, attributable to the quartz crucible may be expressed as $$R_x = \rho \frac{t}{A}$$

wherein $\rho$ is the resistivity of quartz, $t$ is the thickness of the quartz and $A$ is the contacting surface area. For practical purposes, this may then be considered as an expression of the resistance in the crucible assembly circuit. From this relationship it can be shown that at any time during crystal growth the resistance in the crucible assembly circuit, $R_x$, is $$R_x = \frac{\rho t}{A_o + kh}$$

wherein $A_o$ is the resistance of the bottom of the crucible, $k$ is a constant and $h$ is the height of the melt volume in the crucible.

Figure 2:
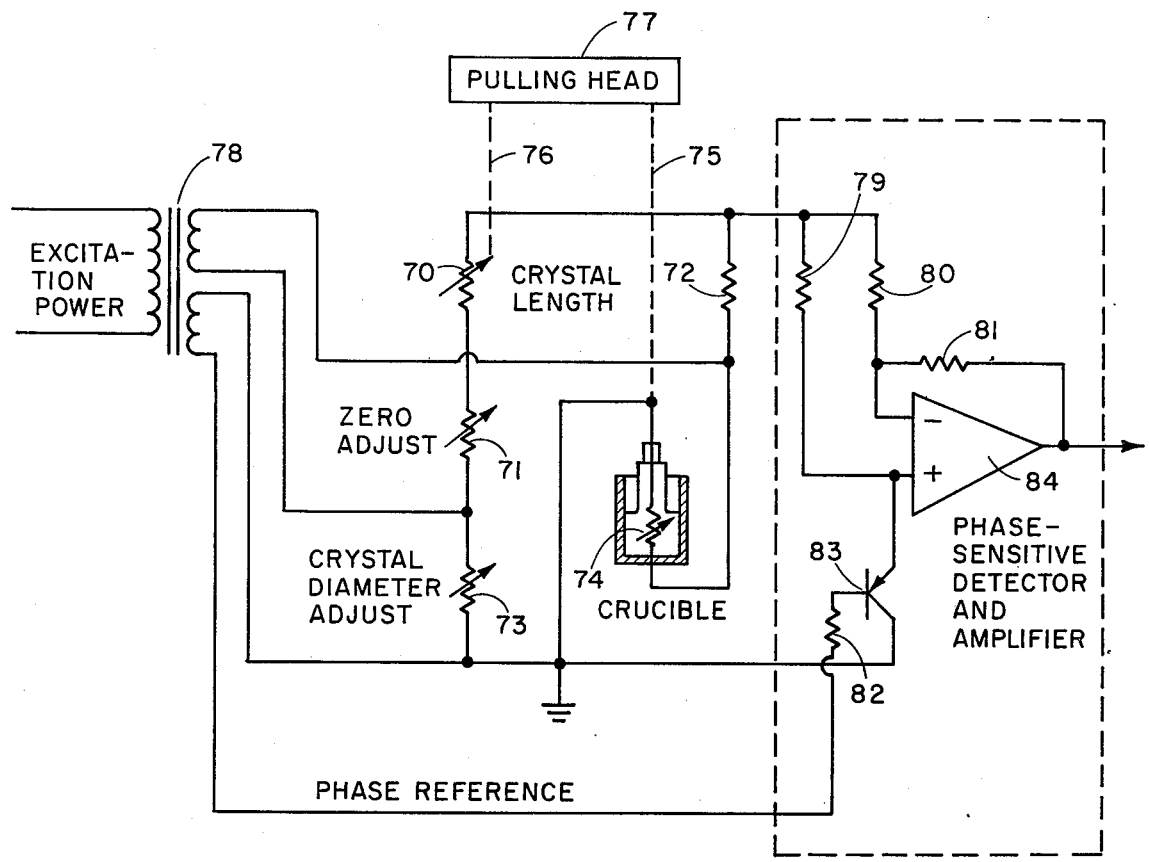
FIG. 2 is one embodiment of the crystal diameter monitoring and control means using AC circuitry.

By monitoring this crucible assembly circuit resistance and comparing it with a previously determined programmed resistance function in a suitable comparator, a signal is generated which is a function of the difference between the actual and the predetermined programmed resistance. This signal is then employed to adjust either the pulling rate by adjusting the variable-speed motor 20 or the temperature of the melt volume by adjusting the power input to heating means 28. Thus FIG. 2 illustrates both of the alternative routes for effecting the control over the crystal diameter. In those cases where a very large melt volume is involved, it may generally be preferable to adjust the pulling rate since changing the heat input into melt volume 10 may not achieve a sufficiently rapid response. However, as noted below, changing of the heat input can have a stabilizing effect. In the case where the melt volume is relatively small, either operational parameter may be varied.

Figure 3:
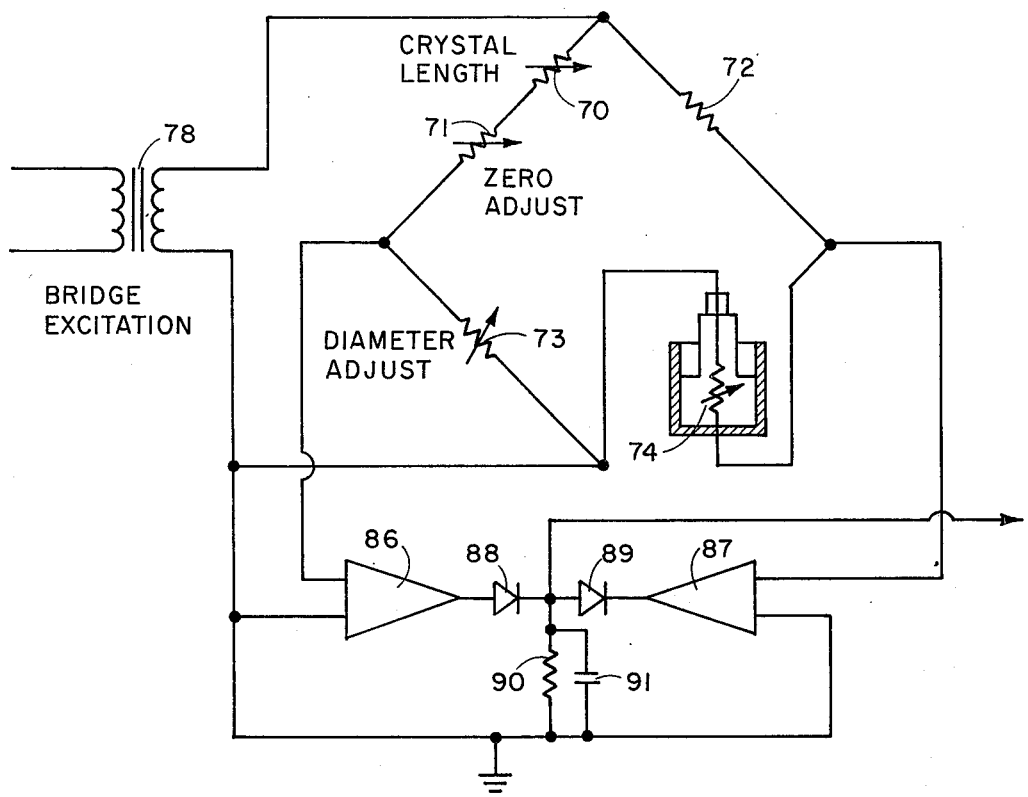
FIG. 3 is another embodiment of the crystal diameter monitoring and control means using AC circuitry.
Figure 4:
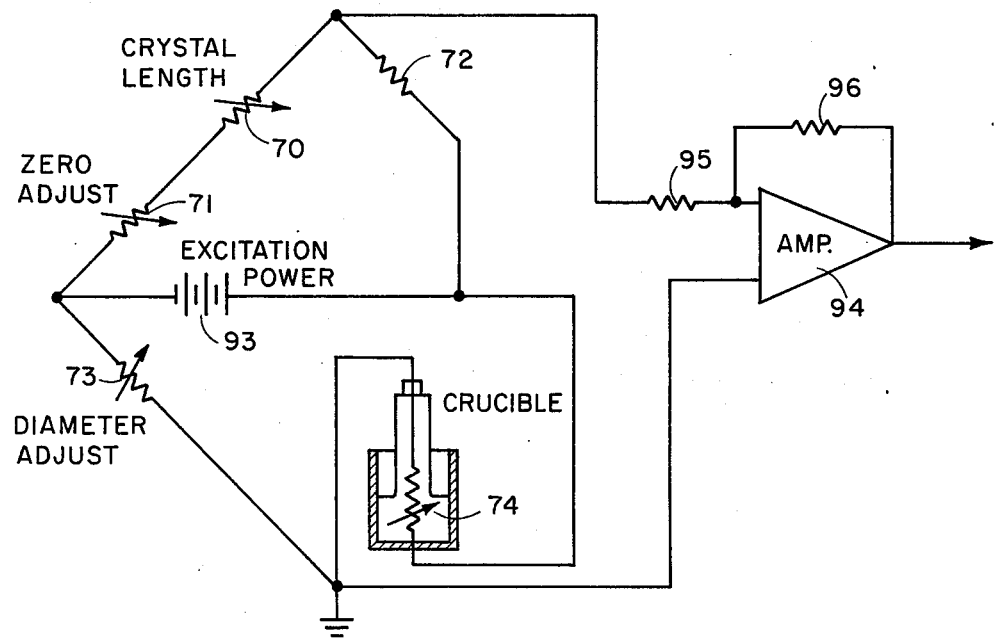
FIG. 4 is an embodiment of the crystal diameter monitoring and control means using DC circuitry.

FIGS. 2–4 illustrate exemplary embodiments of the circuitry for monitoring and controlling the diameter of semiconductor materials in accordance with this invention. These circuits are conveniently bridge circuits as will be seen from the drawings. In the embodiment of FIG. 2, resistance 70, designated "crystal length" constitutes the programmed resistance function which is typically a linearly decreasing resistance based on the desired diameter of the crystal to be formed and the pull rate at which it is withdrawn from the melt volume. For any given system this is readily determinable, normally in terms of ohms per lineal unit of length of the crystal formed. Resistance 71, designated "zero adjust", is in effect a part of resistance 70, it being shown in FIG. 2 as a separate adjustable resistance used to make any minor adjustment in balancing the bridge circuit at the time of starting the crystal forming process. It is also within the scope of this invention to combine resistances 70 and 71, if desired. Resistance 72 forms another balancing resistance in the bridge. Resistance 73, designated "crystal diameter adjust" is set to correspond with the predetermined desired uniform crystal diameter; and resistance 74, designated "crucible" is, of course, the resistance of the crucible assembly circuit during crystal growing.

The placement of the linearly decreasing resistances 70 and 71 in the bridge compensates exactly for the variation in the crucible assembly circuit resistance which is inversely proportional to melt volume height. In practice this permits the use of a simple mechanical drive mechanism, represented by dotted lines 75 and 76, between the pulling head 77 (including load-bearing rod 17 and variable-speed motor 20 (FIG. 1) and a potentiometer serving as resistance 70. Thus this arrangement simplifies, in practice, the generation of the programmed resistance function. In an alternative, but somewhat less desirable, arrangement resistance 73 could be used as a nonlinearly increasing function of the crystal length during its growth.

AC power is supplied to the circuitry from any suitable source such as transformer 78; and the remaining circuit components making up the comparator comprise a phase-sensitive detector, which includes resistors 79, 80, 81 and 82, transistor 83, and amplifier 84, the output of which is the signal transmitted to either power supply 26 of variable-speed motor 20. Such a compurator circuit is known.

In operation, resistance 70 is programmed to develop a resistance which decreases at a rate commensurate with the pulling rate and crystal diameter chosen for the run. If the crucible assembly circuit resistance 74 does not follow the inverse of resistance 70, then the bridge becomes unbalanced, a state which is recognized and evaluated in the phase-sensitive detector and amplifier 84. If the crucible assembly resistance 74 is too small, it means that the level of melt volume in the crucible is decreasing too slowly and the crystal diameter is too small. This can be remedied by decreasing the pulling rate or the melt volume temperature. If, on the other hand, resistance 74 is too large, it means that the melt volume in the crucible is decreasing too rapidly and the crystal diameter is too large. This is, of course, remedied by increasing the pulling rate or the melt volume temperature. Although the response to melt volume temperature may be slower in the case of a very large melt volume, the changing of this temperature to control crystal diameter does have a stabilizing effect in that it simultaneously changes the crystal diameter and the crucible assembly circuit resistance because of the negative temperature coefficient of resistance of the crucible material. This dual response is not attained by changing the rate at which the pulling head moves upwardly.

In the embodiment of the crystal diameter monitoring and control means of this invention shown in FIG. 3, the basic bridge circuitry is essentially the same as that described for FIG. 2. However, in FIG. 3 the comparator comprises amplifiers 86 and 87 and diodes 88 and 89 associated with the programmed signal and crucible assembly circuits and resistance 90 and capacitance 91. The resulting operational signal representative of the difference between the two signals is employed as previously described. In the circuit arrangement of FIG. 3, comparison of the two signals occurs at the output of the amplifier rather than by the two opposing rectifier 88 and 89.

Although it is generally preferred to use AC circuitry such as illustrated in FIGS. 2 and 3, because the crucible assembly tends to generate a small DC potential, it is possible to use DC circuitry such as illustrated in FIG. 4. In the embodiment of FIG. 4, excitation power is furnished by a suitable source of DC power such as battery 93 and the entire bridge serves as the comparator. A DC amplifier 94, with appropriate resistances 95 and 96, is provided to increase the signal to that level necessary to exercise the desired control over the crystal diameter. The operational signal from amplifier 94 is transmitted to either the variable-speed motor 20 or power supply 26 (FIG. 1).

Although the apparatus of this invention has been shown in conjunction with the use of a high-pressure, high-temperature furnace required to handle semiconductor materials having at least one volatile constituent, it is also, of course, applicable to forming semiconductor crystals by the Czochralski technique under any conditions, whether or not confined. As pointed out previously, those materials such as GaP, GaAs, HgCdTe and the like present the most difficult problems in connection with their handling in a molten condition and therefore they have been taken as illustrative of the use of this apparatus.

It will thus be seen that the objects set forth above, among those made apparent from the preceding description, are efficiently attained and, since certain changes may be made in the above constructions without departing from the scope of the invention, it is intended that all matter contained in the above description or shown in the accompanying drawings shall be interpreted as illustrative and not in a limiting sense.

We claim:

1. In an apparatus for forming a single semiconductor crystal by pulling said crystal attached to a seed crystal from a melt volume and comprising a crucible formed of a dielectric material containing said melt volume, support means for said crucible, heating means, load-bearing rod means for holding said seed crystal and for imparting translational motion to said crystal attached to said seed crystal, and variable-speed motor means to drive said load-bearing rod means, the improvement comprising means to monitor and control the diameter of said crystal as it is formed, said means comprising crucible assembly circuit means to provide an electrical current through said seed crystal, crystal, melt volume and crucible thereby to generate a measured signal, said crucible serving as a variable resistance, the value of which varies with the level of said melt volume in it; means to provide a reference signal representative of a predetermined crystal diameter and formation rate; comparator means to determine the difference between said measured signal and said reference signal and to generate an operational signal which is a function of said difference; and means to transmit said operational signal to either said heating means or to said variable-speed motor means whereby the temperature of said molten mass or the rate of said translational motion is varied to maintain the diameter of said crystal essentially uniform throughout its formation.

2. An apparatus in accordance with claim 1 wherein said crucible is formed of quartz.

3. An apparatus in accordance with claim 1 wherein said crucible is configured as a right cylinder.

4. An apparatus in accordance with claim 1 wherein said comparator means comprises bridge circuit means having resistances representative of the changing length of said crystal and of said predetermined crystal diameter, said variable resistance of said crucible and a balancing resistance.

5. An apparatus in accordance with claim 4 wherein said resistance representative of said changing length of said crystal is linearly decreasing to compensate for the variation in said variable resistance of said crucible.

6. An apparatus in accordance with claim 5 wherein said means to provide said electrical current and said means to provide said reference signal include an AC power source.

7. An apparatus in accordance with claim 6 wherein said comparator, in addition to said bridge means, comprises phase sensitive detector amplifier means.

8. An apparatus in accordance with claim 6 wherein said comparator, in addition to said bridge means, comprises separate amplifier means for said measured signal and said reference signal and opposing rectifier means.

9. An apparatus in accordance with claim 4 wherein said means to provide said electrical current and said reference signal include a DC power source.

10. An apparatus for forming a single semiconductor crystal by pulling said crystal attached to a seed crystal from a melt volume, comprising in combination
   a. a crucible formed of a dielectric material containing a melt volume from which said crystal is to be pulled;
   b. support means for said crucible;
   c. heating means for forming and maintaining said melt volume;
   d. pulling head means to hold a seed crystal and said crystal attached thereto and to impart translational motion to said crystal as it grows;
   e. variable-speed motor means to drive said pulling head means;
   f. crucible assembly circuit means to provide an electrical current through said seed crystal, crystal, melt volume and crucible thereby to generate a measured signal, said crucible in said circuit serving as a variable resistance, the value of which varies with the level of said melt volume in it;
   g. programmed resistance function means to provide a reference signal representative of a predetermined crystal diameter and crystal pulling rate;
   h. comparator means to determine the difference between said measured signal and said reference signal to generate an operational signal which is a function of said difference; and
   i. operational correction means responsive to said operational signal to adjust the operation of said apparatus to form said crystal with said predetermined crystal diameter.

11. An apparatus in accordance with claim 10 wherein said crucible is formed of quartz.

12. An apparatus in accordance with claim 10 wherein said comparator means comprises bridge circuit means having resistances representative of the changing length of said crystal and of said predetermined crystal diameter, said variable resistance of said crucible and a balancing resistance.

13. An apparatus in accordance with claim 12 including linkage means between said pulling head and said resistance representative of the changing length of said crystal.

14. An apparatus in accordance with claim 13 wherein said resistance representative of said changing length of said crystal is linearly decreasing to compensate for the variation in said variable resistance of said crucible.

15. An apparatus in accordance with claim 10 wherein said operational correction means comprises means to transmit said operational signal to said variable-speed motor means thereby to effect an adjustment in the rate of translational motion of said pulling head.

16. An apparatus in accordance with claim 10 wherein said operational correction means comprises means to transmit said operational signal to said heating means thereby to change the temperature of said melt volume.

17. An apparatus in accordance with claim 10 wherein said heating means comprise rf coil means and said support means for said crucible is formed of graphite.

18. An apparatus in accordance with claim 10 including housing means defining around said crucible, support means, heating means and pulling head means a sealed volume in which pressure and temperature may be controlled.

* * * * *